US011633918B2

United States Patent
Totzeck et al.

(10) Patent No.: US 11,633,918 B2
(45) Date of Patent: Apr. 25, 2023

(54) METHOD AND DEVICE FOR ADDITIVE MANUFACTURING UTILIZING SIMULATION TEST RESULTS OF A WORKPIECE

(71) Applicant: Carl Zeiss Industrielle Messtechnik GmbH, Oberkochen (DE)

(72) Inventors: Michael Totzeck, Schwaebisch Gmuend (DE); Danny Krautz, Berlin (DE); Diana Spengler, Aalen (DE); Uwe Wolf, Magdala (DE); Christoph-Hilmar Graf Vom Hagen, Oakland, CA (US); Christian Holzner, Wettringen (DE); Lars Omlor, Pleasanton, CA (US)

(73) Assignee: Carl Zeiss Industrielle Messtechnik GmbH, Oberkochen (DE)

( * ) Notice: Subject to any disclaimer, the term of this patent is extended or adjusted under 35 U.S.C. 154(b) by 499 days.

(21) Appl. No.: 16/722,159

(22) Filed: Dec. 20, 2019

(65) Prior Publication Data
US 2020/0223146 A1 Jul. 16, 2020

Related U.S. Application Data

(63) Continuation of application No. PCT/EP2018/066304, filed on Jun. 19, 2018.

(30) Foreign Application Priority Data

Jun. 20, 2017 (DE) ...................... 10 2017 210 330.2
Oct. 17, 2017 (DE) ...................... 10 2017 124 100.0

(51) Int. Cl.
*B29C 64/393* (2017.01)
*B29C 64/153* (2017.01)
(Continued)

(52) U.S. Cl.
CPC .......... *B29C 64/393* (2017.08); *B29C 64/153* (2017.08); *B29C 64/188* (2017.08);
(Continued)

(58) Field of Classification Search
CPC .................................................. B29C 64/393
(Continued)

(56) References Cited

U.S. PATENT DOCUMENTS 8,514,389 B2 8/2013 Aoki
2010/0174392 A1 7/2010 Fink et al.
(Continued)

FOREIGN PATENT DOCUMENTS

CN 1664550 A 9/2005
CN 106003726 A 10/2016
(Continued)

OTHER PUBLICATIONS

Bendjus et al.: Laser-Speckle-Potometire—optische Sensorik zur Zustands—und Prozessuberwachung; 12. Desdner Senso-Symposium 2015, p. 245-250.
(Continued)

*Primary Examiner* — Suresh Suryawanshi
(74) *Attorney, Agent, or Firm* — Miller Johnson

(57) ABSTRACT

Methods and devices for additive manufacturing of workpieces are provided. For analysis during production, a test is carried out using a selected test method. The test results are compared with simulated test results derived during a simulation of the manufacturing and testing. The test may use one or more of a laser ultrasound test unit, an electronic laser speckle interferometry test unit, an infrared thermography test unit, or an x-ray test unit.

14 Claims, 5 Drawing Sheets

(51) Int. Cl.
*B29C 64/188* (2017.01)
*B29C 64/268* (2017.01)
*B33Y 10/00* (2015.01)
*B33Y 30/00* (2015.01)
*B33Y 40/00* (2020.01)
*B33Y 50/02* (2015.01)

(52) U.S. Cl.
CPC ............. *B29C 64/268* (2017.08); *B33Y 10/00* (2014.12); *B33Y 30/00* (2014.12); *B33Y 40/00* (2014.12); *B33Y 50/02* (2014.12)

(58) Field of Classification Search
USPC .......................................................... 700/98
See application file for complete search history.

(56) References Cited

U.S. PATENT DOCUMENTS

| | | | |
|---|---|---|---|
| 2015/0219444 A1* | 8/2015 | Bamberg | B23K 26/032 264/408 |
| 2016/0176117 A1* | 6/2016 | Lee | G05B 19/4099 700/98 |
| 2016/0318255 A1 | 11/2016 | Ou et al. | |
| 2017/0028703 A1* | 2/2017 | Xu | G01N 29/12 |
| 2017/0297095 A1* | 10/2017 | Zalameda | B33Y 10/00 |
| 2017/0343984 A1* | 11/2017 | Czinger | G06F 30/17 |
| 2018/0236714 A1* | 8/2018 | Thelakkadan | B29C 64/295 |
| 2019/0022946 A1* | 1/2019 | Jones | B33Y 30/00 |
| 2020/0039145 A1* | 2/2020 | Kastsian | B22F 10/30 |

FOREIGN PATENT DOCUMENTS

| | | |
|---|---|---|
| DE | 10 2006 025 262 A1 | 12/2007 |
| DE | 10 2014 212 246 B3 | 8/2015 |
| DE | 11 2015 004 279 T5 | 6/2017 |
| DE | 10 2016 201 290 A1 | 8/2017 |
| WO | WO-201 6082810 A1 | 6/2016 |
| WO | WO-2018234331 A1 | 12/2018 |

OTHER PUBLICATIONS

Bamberg et al.: Online process monitoring by means of ultrasound within the scope of additive manufacturing; DGZfP; 2014; 31 pages.

Loucas Papadakis et al.: Numerical Modeling of Heat Effects during Thermal Manufacturing of Aero Engine Components; Proceedings of the World Congress on Engineering 2012 vol. III, Jul. 6, 2012 (Jul. 6, 2012), Seiten 1-6, XP055259905, London, UK; ISBN: 978-988-1925-22-0; URL:http://www.iaeng.org/publication/WCE2012/WCE2012_pp1518.

International Preliminary Report on Patentability for PCT/EP2018/066304; dated Jan. 2, 2020; 8 pages.

* cited by examiner

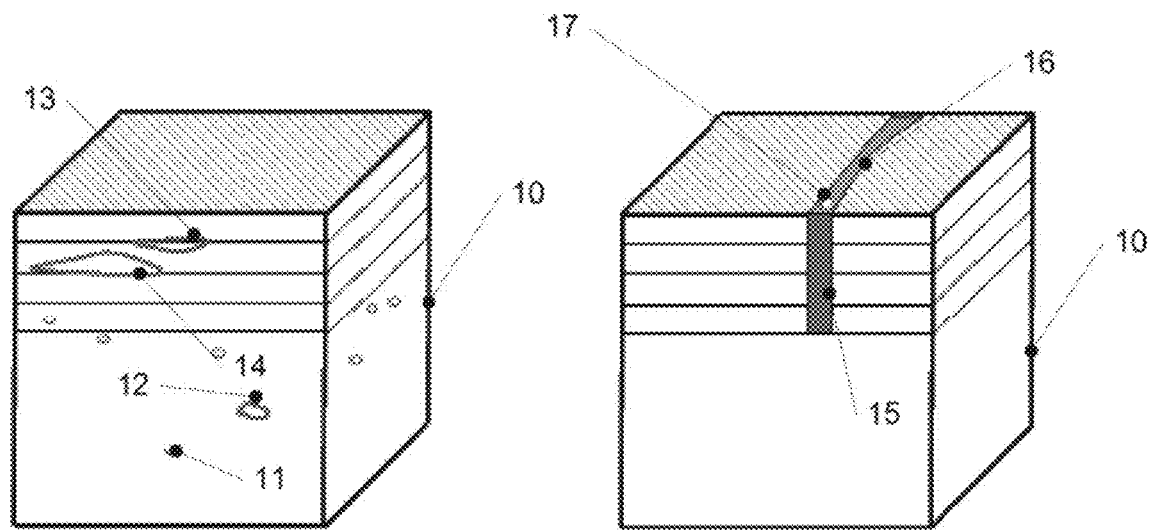
Fig. 1A (Prior Art)    Fig. 1B (Prior Art)
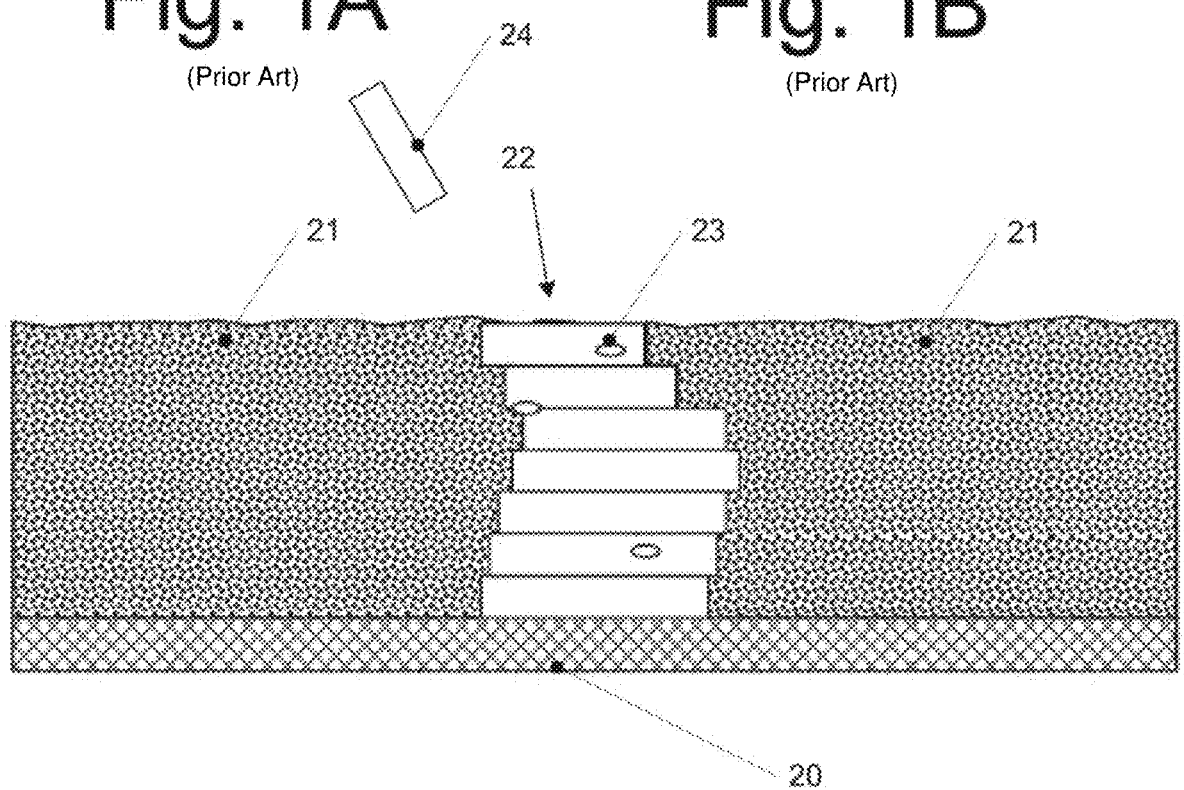
Fig. 2 (Prior Art)

METHOD AND DEVICE FOR ADDITIVE MANUFACTURING UTILIZING SIMULATION TEST RESULTS OF A WORKPIECE

CROSS-REFERENCE TO RELATED APPLICATIONS

This application is a continuation of International Application No. PCT/EP2018/066304 filed Jun. 19, 2018, which claims priority to DE 10 2017 210 330.2 filed Jun. 20, 2017 and DE 10 2017 124 100.0 filed Oct. 17, 2017. The entire disclosures of the applications referenced above are incorporated by reference.

BACKGROUND

The present application relates to methods and devices for additive manufacturing of workpieces. Additive manufacturing of this type may also be referred to as 3D printing.

In additive manufacturing, a shape of a workpiece is produced by applying, i.e. adding, material. In particular, in many additive manufacturing methods, three-dimensional workpieces are built up layer by layer. That differentiates additive manufacturing from subtractive manufacturing, in which material is removed from a blank in order to manufacture a workpiece having a desired shape. Additive methods are becoming increasingly important since here in the meantime even comparatively complex shapes of workpieces can be realized by corresponding programing of a manufacturing device, for example by what is called a 3D printer.

Whereas in traditional subtractive manufacturing the quality and in particular the homogeneity of the material used is influenced only minimally by the manufacturing process and substantially depends on the quality of the material of the blank used, material, structure and shape of the workpiece are produced simultaneously in additive manufacturing. Material defects can thus occur more easily in the production process. Such material defects can be located within a workpiece and become apparent as pure material defects. In addition, they can result in shape defects at the surface of a workpiece. Examples of this are illustrated in FIGS. 1A, 1B and 2.

FIGS. 1A and 1B each schematically show a workpiece 10 manufactured in a plurality of layers by means of an additive manufacturing method. As shown in FIG. 1A, material defects can occur during the additive production process, for example micropores 11, larger pores 12, cracks 13 or layer delaminations 14, in the case of which the layers produced do not correctly adhere to one another. In addition, as shown in FIG. 1B, material stresses can occur, which can result in surface pores 17 or depressions 16 in the surface and also shape defects.

One typical additive manufacturing method is the powder bed method, in which individual layers of a metal powder are selectively hardened. Here, too, material defects can occur during hardening, as is illustrated schematically in FIG. 2. In the cross sectional view in FIG. 2, metal powder 21 is situated on a baseplate 20. A workpiece 22 is formed by selective hardening layer by layer. This selective hardening layer by layer can take place for example by means of sintering using a laser 24 (laser sintering). The laser 24 in FIG. 2 serves to melt the metal powder 21 locally where a layer of the workpiece 22 is to be created, the metal powder 21 then subsequently solidifying. In other variants, a binder can be used. In this case, pores 23 or other material defects already explained with reference to FIGS. 1A and 1B can form.

In safety critical applications, in particular, it is important to be able to recognize such material defects in workpieces in order, if appropriate, to be able to take measures, such as, for example, rejecting a workpiece.

EP 2 277 687 B1 and EP 1 486 317 B1 disclose methods for determining production parameters for a laser-sintered component. In these methods, additive manufacturing is simulated, and physical properties of the component manufactured are calculated from the simulated production process, such as, for example, geometric dimensions of the workpiece and mechanical properties. These calculated properties are then compared with properties of the component actually produced. In order to ascertain the latter properties, the component actually produced has to be partly destroyed, depending on analysis methods used and properties measured. Production parameters can then be optimized on the basis of the comparison.

This method thus serves for optimizing production parameters, but does not allow monitoring of ongoing production and, in particular, non-destructive detection of material defects in ongoing component production.

JP 2017/094728 A1 discloses an ultrasound based method for process monitoring with use of the sound emission of the powder bed such as, for example, the powder bed 21 in FIG. 2. US 2017/0144250 A1 describes a sound emission of a device for applying a layer of metal powder, referred to therein as "recoater." US 2017/0146489 A1 discloses the use of laser based ultrasonic inspection in an additive manufacturing installation on the basis of a powder bed method.

Laser based ultrasonic inspection is a method for generating ultrasound in a noncontact manner by means of a laser in a sample, for example a workpiece produced by an additive manufacturing method, and for detecting said ultrasound in turn in a noncontact manner. The method per se is described for example in the chapter "Optical Generation and Detection of Ultrasound" by Jean-Pierre Monchalin in the book Physical Acoustics, edited by O. Leroy and M. A. Breazeale, Plenum Press, New York, 1991. The laser beam generates an acoustic wave in the material of the sample, said acoustic wave propagating at the speed of sound in the material. The principle of the excitation of thermoelastic waves by means of modulated laser radiation is also described for example in Wang, X.; Xu, X.: "Thermoelastic wave induced by pulsed laser heating," Applied Physics A 73, 2001, pages 107-114.

Inhomogeneities within the sample scatter the sound wave, part of which is guided back again to the object surface as a result. There it results in a temporary local height offset of the object surface, a lateral offset, or both. This movement can be detected by a second optical system, for example by means of a topography measurement and laser vibrometry, which utilizes the frequency shift of light reflected at the moved surface, said frequency being caused by the Doppler effect. A description of various methods for detecting ultrasound at surfaces is found for example in R. J. Dewhurstdag and Q. Shanddag, "Optical remote measurement of ultrasound," Measurement Science and Technology, Vol. 10, No. 11.

However, ultrasound methods of this type cannot easily be applied to an additively manufactured workpiece in particular in a powder bed such as that in FIG. 2. In the customary application of such methods for non-destructive material testing, the object to be tested is largely homogeneous, and has only few defects. In contrast thereto, the powder bed 21 in FIG. 2 forms a highly inhomogeneous environment for the workpiece 22, in which sound waves are scattered greatly. The sudden change in impedance that is relevant to the scattering cross section is very great in a metal powder since the speed of sound is approximately 330 m/s in air and for example 6000 m/s in steel. That corresponds to an impedance ratio of 20. Moreover, the particles of the metal powder are free (not bonded to one another), such that macroscopic movements of the metal bodies of the metal powder are also possible besides crystal lattice vibrations as in homogeneous crystalline materials. The propagation of sound waves in powders is described for example in Xiao Ping Jia, J. Laurent, Y. Khidas and V. Langlois, "Sound scattering in dense granular medium," Chinese Science Bulletin Vol. 54 No. 23, pages 4327-4336, 2009, or in O. Mouraille and S. Luding: "Sound propagation in dense, frictional granular materials" in Powders and Grains 2005, Editors R. Garcia-Rojo, H. J. Herrmann and S. McNamara, page 319, Leiden, 2005, A. A. Balkema Publishers.

One important scaling parameter for sound propagation here is the grain size of the metal powder. Sound waves having a wavelength in the powder of distinctly more than the grain size propagate in the powder approximately as in a homogeneous material, while sound waves having a wavelength smaller than the grain size are scattered greatly by the grains.

The great scattering in the powder results in a superimposition of the signal originating from defects in the workpiece with a strong background. Moreover, structures produced by additive manufacturing methods are often filigree and complex, i.e. they have in relation to their volume a large surface area of complex configuration, which likewise scatters sound waves greatly.

Therefore, the acoustic scattered signal detected by such methods is complex and composed of a large contribution from the powder bed, a medium sized contribution from the surface of the workpiece and a comparatively small contribution resulting from material defects. Therefore, it can be difficult to detect material defects correctly using conventional procedures, on account of such signals. In the case of the analysis, it should additionally be noted here that a portion of the defects that can occur during additive manufacturing is cumulative, i.e. they show effects only after a series of layers have been manufactured. By way of example, as a result of stresses in a topmost layer, layers underneath can be delaminated, or cracks can form therein. Whether pores that form are critical also depends on how many pores there are in the vicinity. Moreover, stresses form in the material often only after a plurality of layers.

A further known method for non-destructive testing of workpieces is electronic speckle interferometry (ESPI). DE 10 2014 202 020 B4 describes the use of electronic speckle interferometry for ascertaining a surface stress in a region around a melting bath which is produced during laser sintering in a powder bed, without drawing conclusions therefrom about material defects or material stresses situated below the surface. ESPI as described above is limited to a surface analysis for ascertaining stresses and superficial pore formations or inclusions.

U.S. Pat. No. 6,043,870 B describes an ESPI device with compact fiber optics for industrial applications in order to identify material anomalies and delaminations by means of thermal excitations. Possible material specific properties and problems, for example problems as a result of signals from a powder bed, are not discussed. U.S. Pat. No. 6,043,870 A also describes an ESPI system for use in industrial material analysis in general, wherein a thermal excitation is performed. Scientific publications, for example H. Gerhard, G. Busse, WCU 2003, Paris, Sep. 7-10, 2003, describe a variation of ESPI by means of acoustic and thermal excitation during the analysis of polymers and ceramic workpieces. The examination of these excitation methods focuses on plastics in these scientific publications.

Moreover, the literature describes methods which allow a 3D reconstruction of a workpiece from thermal data, for example Fernando López Rodriguez, Vicente de Paulo Nicolau, Inverse heat transfer approach for IR image reconstruction: Application to thermal non-destructive evaluation, Applied Thermal Engineering, Vol. 33, 2012, pages 109-118, ISSN 1359-4311.

SUMMARY

In view of the above, it is an object of the present application to provide methods and devices which make it possible to test workpieces produced by additive methods during production.

It is a further object to provide methods and devices which make it possible to test workpieces produced by additive manufacturing using a powder bed.

It is yet another object to provide test methods and devices which can cope with high background signals originating from a powder bed.

In accordance with a first aspect of the invention, a method for additive manufacturing of workpieces is provided, comprising the steps of providing manufacturing data for a workpiece, simulating the manufacturing of the workpiece, simulating test results during the manufacturing on the basis of the simulated manufacturing, adding a next group of layers to the workpiece, testing the group of layers in order to obtain measured test results, evaluating the testing on the basis of the simulated test results and the measured test results, repeating the adding, the testing and the evaluating if the evaluating indicates acceptable manufacturing, and taking (implementing) a measure if the evaluating indicates unacceptable manufacturing.

In accordance with a second aspect, a device for additive manufacturing of workpieces is provided, comprising a simulation unit for simulating additive manufacturing of a workpiece and for simulating test results during the manufacturing, comprising a manufacturing unit for additive manufacturing of the workpiece, and comprising a test unit for testing the workpiece during the additive manufacturing in order to obtain measured test results, wherein the test unit is configured to test the workpiece after a respective next group of layers has been added, and the simulation unit is configured to carry out evaluating on the basis of the simulated test results and the measured test results and to cause a measure to be taken if the evaluating indicates unacceptable manufacturing of the workpiece.

In accordance with a third aspect, a method for additive manufacturing of workpieces is provided, comprising the steps of manufacturing a workpiece by an additive manufacturing method, and analyzing the workpiece during the manufacturing by means of a combination of infrared thermography and electronic speckle interferometry.

In accordance with a fourth aspect, a device for manufacturing a workpiece is provided, comprising a manufacturing device for additive manufacturing of the workpiece, and an analysis device for analyzing the workpiece during the manufacturing, wherein the analysis device can comprise a unit for electronic laser speckle interferometry and a unit for infrared thermography.

By means of a combination of a simulation of test results and an actual test, i.e. measurement of the workpiece produced, a deviation on account of material defects can be recognized even for relatively complex situations. Preferably, the manufacturing of the workpiece is simulated using the manufacturing data provided and using a model for additive manufacturing. Particularly preferably, the model for additive manufacturing includes a model for producing material layers which are arranged one on top of another and are connected to one another, wherein the individual material layers are produced for example by melting and/or adhesive bonding of powder particles arranged in a powder bed. The model for additive manufacturing can model for example the temperature distribution that arises depending on the ambient temperature and depending on targeted local energy irradiation, such as, for instance, laser irradiation by a laser light source, in the powder bed. Furthermore, in the preferred example embodiments the model represents the shape and the position of the individual material layers, dimensions, such as, for instance, the length or thickness of selected material layers, and/or the bonding thereof. Preferably, the step of simulating yields a representation of the workpiece to be produced that varies depending on the manufacturing parameters selected for the simulation, such as, for instance, particle size, particle homogeneity, ambient temperature, processing temperature, feed rate of the tool.

Simulating test results preferably includes computationally determining parameters which characterize the representation mentioned above. The test results can include one or more of the following parameters: Roughness of one or more surfaces, waviness of one or more surfaces, shape of one or more surfaces, dimensions such as distance, diameter, circumference of selected workpiece regions, temperature or temperature distribution at selected simulated measurement points, and also the presence and optionally the dimensions of pores, cracks, material inclusions, inter alia. In other words, here a simulated measurement is carried out computationally on the workpiece produced in a simulated manner, in order to determine individual properties of the workpiece produced in a simulated manner. It goes without saying that these individual properties vary depending on the manufacturing parameters chosen for the simulation. On the other hand, the individual properties of the workpiece produced in a simulated manner represent a reference workpiece for the workpiece produced in reality.

Adding a next group of layers includes applying a new workpiece layer "really" on workpiece layers already present, using an additive manufacturing method. In preferred example embodiments, this is done, as indicated above, by melting and/or adhesive bonding of powder particles arranged on workpiece layers already present.

The step of testing includes determining individual parameters that characterize the new workpiece layer together with the underlying workpiece layers. The individual parameters can include one or more of the following parameters: Roughness of one or more surfaces, waviness of one or more surfaces, shape of one or more surfaces, dimensions such as distance, diameter, circumference of selected workpiece regions, temperature or temperature distribution at selected measurement points, and optionally the dimensions of pores, cracks, material inclusions, inter alia. The measurement can include the excitation of the new workpiece layers together with the underlying workpiece layers with the aid of an energy source and also the measurement of reflections, transmission or scattering of the energy radiation at the workpiece layers. The energy can be brought to the workpiece layers with the aid of x-ray radiation, UV radiation, IR radiation, visible light radiation and/or using sound, including ultrasound.

The evaluating can comprise evaluating using a system trained by means of machine learning. In this case, learning can be effected by means of training examples, which facilities the evaluating.

The evaluating can comprise comparing the simulated test results with the measured test results. In this regard, by way of example, a contribution of a powder bed can be extracted computationally. In particular, the step of evaluating includes a comparison of the individual parameters of the abovementioned representation and the respective corresponding individual parameters of the new workpiece layer together with the respective underlying workpiece layers. Accordingly, the new method in some example embodiments includes a layer by layer comparison of parameters determined by simulation and parameters determined by measurement. The workpiece produced by additive manufacturing is preferably compared with an expected workpiece structure determined by simulation between the production of individual workpiece layers. The parameters determined by simulation represent workpiece layers that arise under ideal, model conditions. The individual parameters determined in the step of testing represent the real production result. A comparison of the respective parameters makes it possible to recognize deviations of the manufacturing process from the ideal manufacturing process in an efficient manner.

Taking a measure can comprise changing process parameters for subsequently adding a group of layers. This can be adding for a next workpiece to be manufactured or for the same workpiece. In this regard, the evaluating can be used for process improvement.

Taking a measure can also comprise rejecting the workpiece if, for example, the evaluating reveals that the workpiece does not satisfy quality requirements owing to material defects.

The group of layers can comprise a single layer, a plurality of layers or a part of a layer. Depending on requirements, the testing and evaluating can thus be carried out with different frequencies.

The evaluating can comprise using a predefined correlation of differences between the measured test results and the simulated test results with component properties. Thus, by way of example, such correlations can be determined from calibration measurements and can then be applied to the evaluating.

The testing can comprise carrying out a laser ultrasound method. In this case, a laser beam having a pulse frequency of less than $f_{max}=v_M/(d_M+s_M)$ is used in a powder bed method, wherein $v_M$ is the speed of a sound in the homogeneous powder material, $d_M$ is a mean particle diameter of the powder and $s_M$ is a simple standard deviation of the size distribution of the particles of the powder.

The testing can also comprise carrying out electronic laser speckle interferometry.

The testing can also comprise carrying out infrared thermography or an x-ray examination, for example x-ray scatterometry.

The use of a simulation makes it possible to evaluate even complex measurement data from these methods.

The test unit can comprise in particular a laser ultrasound test unit, an electronic laser speckle interferometry test unit, an infrared thermography test unit and/or an x-ray test unit.

The device, in particular the simulation unit, can be configured for carrying out one of the methods described above.

The combination of infrared thermography and electronic laser speckle interferometry makes it possible to effect an accurate analysis.

The analyzing can comprise an evaluation by means of machine learning.

BRIEF DESCRIPTION OF THE DRAWINGS

Embodiments of the new methods and devices are explained in more detail in the following, where FIGS. 1A and 1B show examples of material defects that may occur during additive manufacturing, FIG. 2 shows an example of material defects that may occur during a powder bed method for additive manufacturing.

DETAILED DESCRIPTION

Various example embodiments are explained in detail below. These example embodiments serve merely for illustration and should not be interpreted as restrictive. In this regard, some example embodiments described have a large number of features or components. This should not be interpreted to mean that all these features or components are necessary for the implementation. Rather, other example embodiments can have fewer components or features or else alternative features or components. In addition to the features and components explicitly illustrated and described, it is also possible to provide further features or components, in particular features or components of conventional systems for additive manufacturing or for analysis of workpieces.

Features of different example embodiments can be combined with one another, unless indicated otherwise. Variations and modifications which are described for one of the example embodiments are also applicable to other example embodiments.

Figure 3:
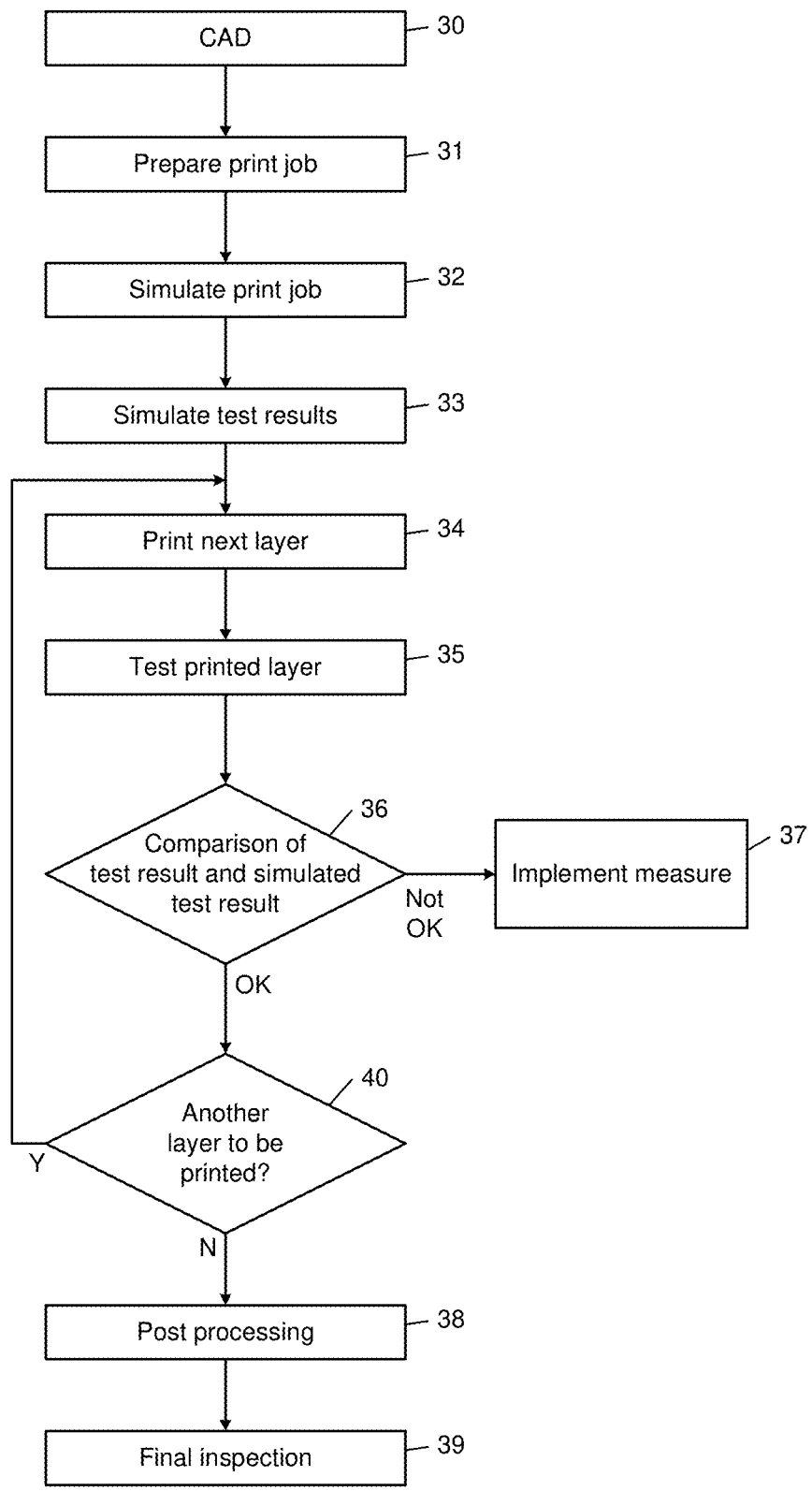
FIG. 3 shows a flow chart for illustrating a method in accordance with one example embodiment.

FIG. 3 shows a flow chart of a method for additive manufacturing of a workpiece in accordance with one example embodiment. Additive manufacturing of this type is also referred to hereinafter as 3D printing, or as printing for short. In this case, powder bed based methods such as, for example, laser sintering or else methods in which a powder, in particular metal powder, is consolidated layer by layer by a binder can be used as production methods. However, this example embodiment and subsequent example embodiments are also applicable to production methods other than powder bed based methods.

In the method, step 30 involves providing a computer aided design (CAD) of a workpiece. Step 31 then involves preparing a print job by converting the computer aided design from step 30 into instructions for a specific device for 3D printing, for example a powder bed based device as explained in the introduction with reference to FIG. 2.

In step 32, the print job is then simulated, i.e. producing the workpiece is simulated layer by layer including the surrounding powder bed. Step 33 then involves simulating test results, i.e. measurement results of a measuring method used for testing the workpiece are simulated for the respective status of production, i.e. after a respective number of applied layers. Measuring methods of this type can comprise, as will be explained later, for example ultrasound based methods, thermographic methods, x-ray scatterometry and/or interferometric methods such as electronic laser speckle interferometry.

Steps 32 and 33 thus constitute a simulation of production of a defect free workpiece, and the test results obtained in step 33 correspond to simulated test results for a defect free workpiece.

In step 34, the actual additive production process then begins with the printing of a next upcoming layer (the first layer when step 34 is effected for the first time). In step 35, the layer printed at 34 is then tested by means of a measuring method for which the simulation was also carried out in step 33. In step 36, the test result of step 35 is then compared with the simulated test result of step 33. By virtue of the fact that here both a simulation of defect free printing and an actual test are carried out and the results are compared, for example effects from a background such as, for example, of a powder bed, as explained in the introduction, can immediately be extracted computationally, and signal components originating from material defects can be identified more easily. Interference influences resulting from the process of additive manufacturing can thus be filtered out of the test measurements even in the case of large volumes of data.

In this case, the comparing in step 36 can comprise simple subtraction of respective signals. Preferably, however, an analysis system is firstly trained and then carries out the comparison in order to obtain more detailed information about defects present. For this purpose, it is possible to use in particular methods of machine learning, for example for training an artificial neural network. Methods of machine learning are described in the German Wikipedia article "Maschinelles Lernen" ["Machine learning"], version on Sep. 27, 2017. For this purpose, in a learning process, the manufactured workpieces are then analyzed using other measuring methods, which can also be destructive methods. By way of example, sections of the workpiece produced can be examined under a microscope, including an electromicroscope, in order to identify various material defects. These identified features are then used, together with the results of the actual measurement ascertained in step 35 and the test results simulated in step 33, as training examples for the machine learning. During actual production, a system trained in this way can then make more accurate statements about material defects present, in step 36, on the basis of the test result of step 35 and the simulated test results of step 33. By way of example, methods of reinforcement learning or other learning methods can be used for the machine learning. In other embodiments, additionally or alternatively, it is possible to carry out correlation analyses between the results of step 35 and the simulation results of step 33.

If the comparison in step 36 reveals that unacceptable defects are present (not okay in step 36; unacceptable manufacturing), for example an excessively high number of material defects or excessively large material defects, appropriate measures can be taken in step 37. Such a measure can be for example rejecting the workpiece just produced, but additionally or alternatively can also comprise adapting process parameters in order to produce fewer material defects in the case of a next layer. As a result of the adaptation of process parameters in step 39 during the process, a component can possibly still "be saved" by virtue of the fact that defects can be restricted to a layer, which can still result in acceptable workpieces, depending on requirements made of the workpiece. Moreover, depending on the manufacturing method, processing of a layer in which too many material defects have occurred can be repeated. For this purpose, the defective layer is removed and applied anew using corrected process parameters. Here a correction is thus possible during the production process and/or for subsequent production processes. Such procedures during correction are also referred to as holistic since here the cause of the disturbance is not necessarily rectified, rather the effect (for example material defects) is recognized and is compensated for by a counteraction, for example by changing process parameters. For the correction, it is possible to carry out further dedicated numerical correlation analyses during the stimulation. In particular, in this case it is also possible to take account of measured machine parameters and the data of further sensors e.g. for monitoring the environmental conditions, by carrying out e.g. a correlation between the measurement results and the sensor data. Moreover, e.g. the effect of the correction can be simulated before the actual additive manufacturing process. This simulation can be part of an optimization algorithm in order to determine an optimum correction process.

For the comparing in step 36, it is also possible to use a predefined "translation table," which indicates on the basis of previous calibrations (analyses of workpieces, for example destructive analysis) a correlation between differences between simulation and actual testing and construction properties of the workpiece.

By contrast, if the comparison at 36 reveals that the layer is okay according to quality requirements (for example the number of material defects present is sufficiently low; acceptable manufacturing) then, at step 40 either the method jumps back to step 34 in order to print a next layer or, if there is no further layer to be printed, i.e. the printing has concluded, any possibly required postprocessing of the workpiece (for example cleaning of adhering powder, polishing etc.) is carried out in step 38. A final inspection of the workpiece produced can then also be carried out in step 39.

With the method in FIG. 3, therefore, each printed layer can be monitored and, on the basis of simulations, it is possible to analyze even complex measurement signatures during the testing.

It should be noted that, in other embodiments, the testing and the comparison of the test result with the simulated test result can also be performed at the interval of a plurality of layers (for example every second layer, every third layer, etc.) or else for parts of layers, rather than after every layer. Moreover, it should be noted that, in contrast to the illustration in FIG. 3, the simulating need not be carried out before the printing, but rather can also be carried out simultaneously therewith, such that for example during, before or after the printing of each layer in step 34 the printing of the respective layer is also simulated and the corresponding test results are simulated. The order illustrated in FIG. 3 therefore serves only for elucidation and should not be regarded as restrictive.

In addition to the monitoring of the production process as illustrated in FIG. 3, the simulation of the growth process and of the measurements can also be used for further purposes as well. This is illustrated schematically in FIG. 4.

Figure 4:
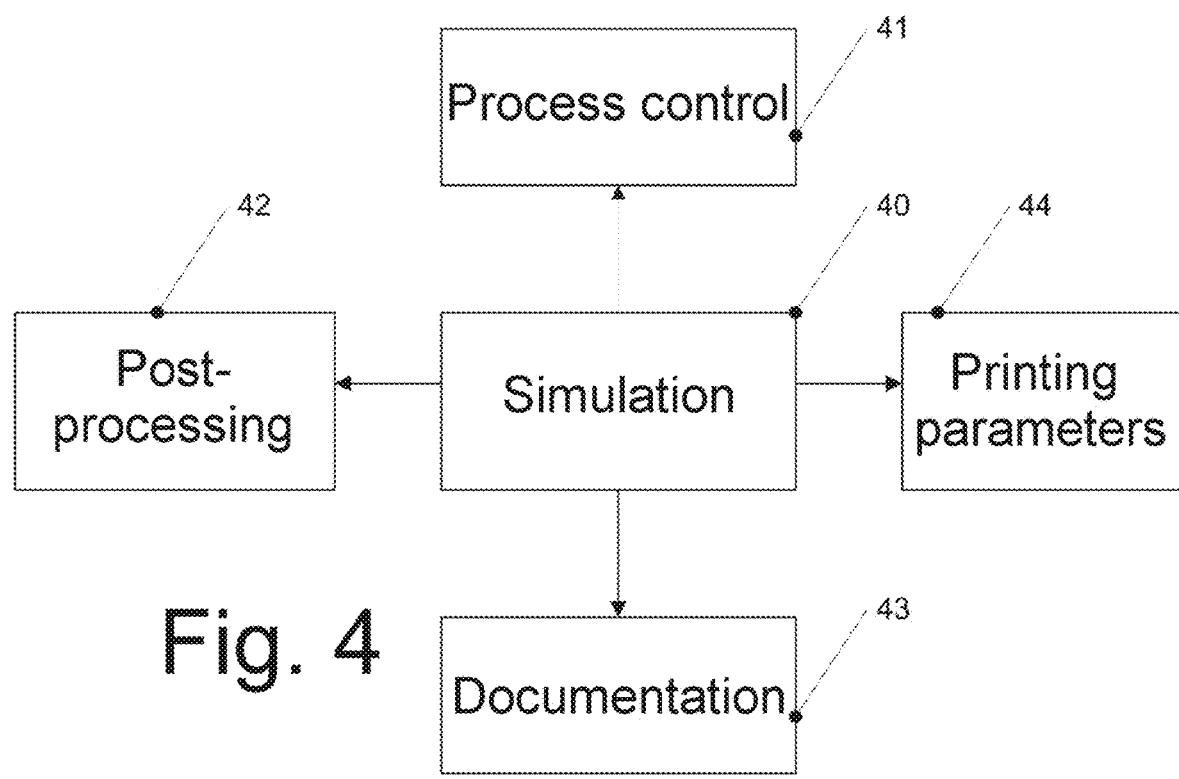
FIG. 4 shows an illustration for illustrating the use of simulations in some example embodiments.

Proceeding from a simulation of a production process 40, which can comprise the simulating in steps 32 and 33 in FIG. 4, various further processes can be controlled, documented or implemented. In this case, the simulation at 40 can be influenced by calibration data of the used device for additive manufacturing and of the powder bed as well as the already mentioned CAD data conditioned for the printing.

At 41, the process control is carried out as explained with respect to FIG. 3, i.e. test results during the process are compared with the simulation and corresponding outputs are effected. Moreover, at 42, indications for the postprocessing in step 38 in FIG. 3 can be given on the basis of the simulation. At 43, on the basis of the simulation, it is possible to create documentation, for example in the form of a CAD file of the manufactured component, if appropriate taking the postprocessing into account. Finally, at 44, as already explained in the introduction and as known per se, printing parameters can be optimized.

Figure 5:
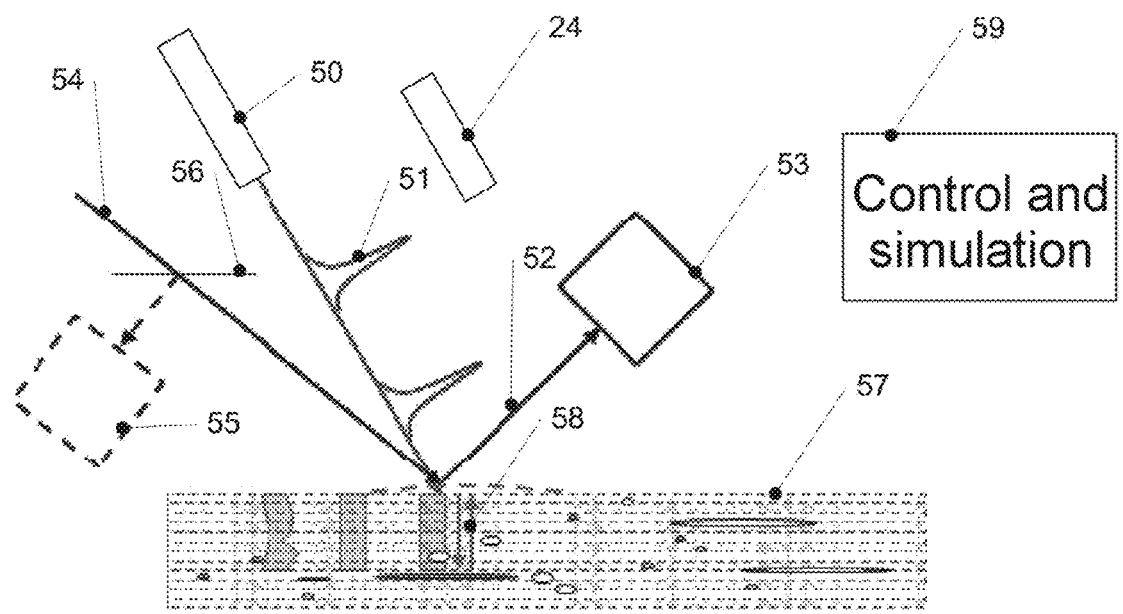
FIG. 5 shows a device for carrying out laser ultrasound based testing of a workpiece in accordance with one example embodiment.

One example of a test method which can be employed in the method in FIG. 3 is a laser ultrasound measurement. Such a measurement is explained with reference to FIG. 5. The device in FIG. 5 serves for testing layer by layer a workpiece 57 which can be produced by an additive method, for example a powder bed method. Conventional techniques for additive manufacturing can be used as additive method. This manufacturing is indicated in FIG. 5 by the laser 24 for laser sintering, which has been described with reference to FIG. 2. The manufacturing and the testing are monitored by a control unit 59, in particular a computer or some other suitable controller. In the example embodiment in FIG. 5, the controller 59 also carries out the simulations (steps 32 and 33 in FIG. 3) and compares the test results with the simulated test results (step 36 in FIG. 3). However, it is also possible to provide separate devices, for example separate computers, for control and simulation.

In the example embodiment in FIG. 5, the surface of the workpiece 57, for testing one or more layers or parts thereof, is irradiated with a pulsed laser beam 51, which is pulsed in the femtoseconds to picoseconds range, by means of a short pulse laser 50. In this case, the laser beam 51 is focused onto the workpiece by a suitable optical unit (not illustrated) and is scanned over the surface of the workpiece 57 by means of a scanning unit (likewise not illustrated). The laser beam 51 induces soundwaves which, as illustrated by arrows 58, are reflected at material defects and bring about a change (in particular deformation) of the surface of the workpiece. This change is detected by a detector system, for example a homodyne interferometer or a heterodyne interferometer. This is illustrated schematically by a detection beam 54 that impinges on the sample. A beam 52 reflected forward is detected by a detector 53. Alternatively or additionally, a beam reflected backward, which beam is coupled out via a beam splitter 56, is detected by way of a detector 45. Any conventional detection mechanism used in laser ultrasound devices can be used here; in this respect, see the documents cited in the introduction with regard to laser ultrasound.

For typical speeds of sound, which for example are 1400 m/s in the case of Teflon and 6100 m/s in the case of titanium, for a maximum structure depth that can be imaged of 0.5 mm, a pulse propagation time of $\Delta t = 2d/c_{sound}$ of 0.2 to 1 µs results, wherein d is the structure depth and $c_{sound}$ is the speed of sound. That means that a scanning system operating in the megahertz range can be used to image 1000*1000 pixels over typical areas under consideration. The total area can be larger if the scan region is restricted to a correspondingly smaller region of interest. A depth resolution of 1 µm necessitates a time resolution for the detection in the gigahertz range, which is possible with laser doppler vibrometers used nowadays.

Figure 6:
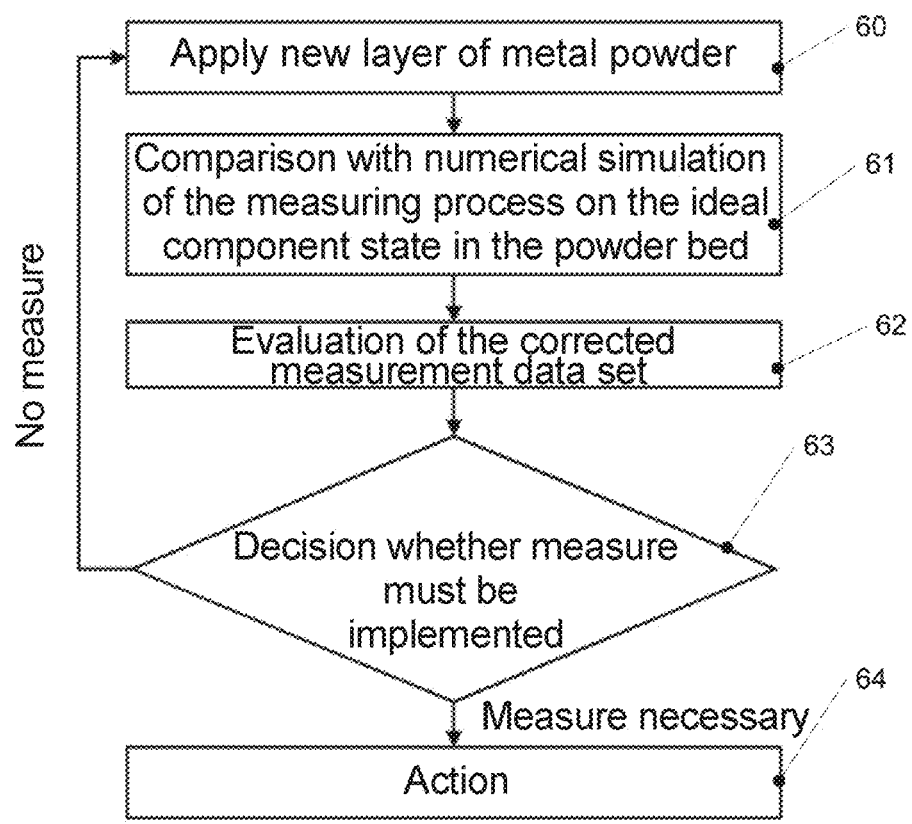
FIG. 6 shows a flow chart of a method in accordance with another example embodiment.

The measurement results found (detected by the detectors 53 and/or 55) are then compared layer by layer with corresponding simulations and evaluated, as described. This is explained once again for the case of powder bed manufacturing in FIG. 6. FIG. 6 thus shows an application of the method from FIG. 3 to powder bed manufacturing and the use of laser ultrasound.

In step 60, a new layer of a metal powder is applied, in particular consolidated. Then a laser ultrasound measurement is carried out and in step 61 the measurement result is compared with a numerical simulation of the measuring process on an ideal (defect free) state of the workpiece in the powder bed. A corrected measurement data set is obtained from this, for example by computationally extracting background originating from the powder bed on the basis of the simulation. On the basis of the evaluation, a decision is taken in step 63 as to whether a measure must be taken. If no measure is necessary, the method is continued with the next layer in step 60. If a measure must be taken, this is done in step 64. In this case, the measures already discussed with reference to step 37 in FIG. 3 can be taken.

A sound wavelength (induced by the short pulse laser) whose wavelength in the material from which the powder is produced is significantly larger than the mean powder grain diameter is preferably used for the measurement. Thus, in particular defects which are larger than the grain diameters can be detected and the geometric dimensions of the workpiece can also be detected. For a powder composed of a material M with a speed of sound $v_M$ in the homogeneous material and a particle size distribution characterized by a mean particle diameter (powder grain diameter) of $d_M$ and a simple standard deviation of the size distribution of the powder grains of $s_M$, a short pulse laser having a maximum frequency $f_{max} < v_M/(d_M + s_M)$ is preferably used. As an example, for a titanium powder having a grain size of 20 µm and a standard deviation of 5 µm, owing to the speed of sound of 6100 m/s, this means a maximum frequency of 244 MHz.

All numerical values indicated are indicated here merely for elucidation and can vary in particular depending on materials and measuring methods used.

A further example of a test method which can be used in step 35 in FIG. 3 is a combination of electronic speckle interferometry (ESPI) with infrared thermography. ESPI is able to detect the surface topography of the workpiece to be tested. The combined excitation by means of infrared thermography makes it possible to analyze pores, cracks, shrink holes, delaminations (layer detachments) and other defects below the surface in the workpiece. The combination of both test methods thus allows a fast areal analysis of the layers being manufactured. By means of the ESPI, it is also possible in particular to characterize the topography of the melting bath with the use of laser sintering, while a currently printed layer or a group of layers is analyzed for defects by means of the infrared thermography. With the use of the method from FIG. 3, the analysis is then carried out once again by comparison with a simulation, wherein in particular as explained it is also possible to use machine learning methods in order to enable an analysis. A test after only a part of a layer has been printed is also possible. ESPI has the advantage that in parallel it is possible to monitor the powder bed for changes during the printing process by means of ESPI.

Figure 7:
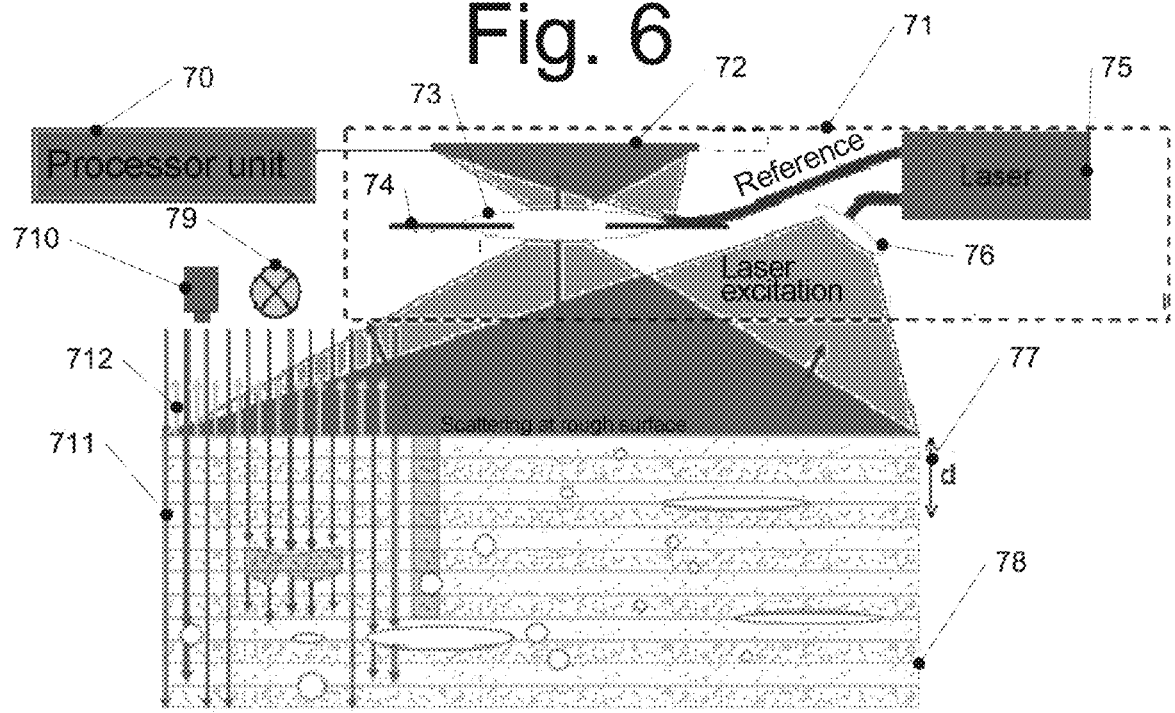
FIG. 7 shows a device for testing a workpiece in accordance with one example embodiment.

FIG. 7 illustrates a device for carrying out combined ESPI with infrared thermography of a workpiece 78 produced by an additive manufacturing method. The workpiece 78 can be produced for example by means of a powder bed method such as laser sintering, for example, as was described briefly with reference to FIG. 2 and as is also indicated in FIG. 5.

Other conventional additive manufacturing methods are also usable. Therefore, those components which are used for the additive manufacturing itself are not explicitly illustrated in FIG. 7.

For ESPI, the device in FIG. 7 comprises an ESPI camera 71. The latter comprises a laser 75. Part of the laser beam generated by the laser 75 is expanded via an optical unit 76 and is directed onto a surface of the workpiece 78.

Light scattered by the surface, in particular roughness at the surface, passes via an imaging optical unit 73, which can be delimited by a stop 74, to an image sensor 72. The image sensor 72 can be for example a CCD sensor or a CMOS sensor.

In addition, part of the laser light generated by the laser 75 is directed as reference onto the image sensor 17 and interferes there with the light scattered by the surface of the workpiece 78. The image sensor 72 records the resulting interference pattern and feeds it to a processor unit 70, which analyzes the recorded interference pattern, in particular compares it with a simulation and, if appropriate, analyzes it on the basis of prior machine learning.

In particular the interference gives rise to a characteristic speckle pattern that deviates from an original shape as a result of manipulations of the surface of the workpiece 78 as a result of deformations, particles, defects, etc. During a controlled manipulation of the workpiece, successive images are then recorded without a change in the relative position of workpiece 78 and ESPI camera 71. In this case, the manipulation can be effected in particular by means of parallel IR thermography, as described below. This manipulation results in small deformations of the object and in the process causes speckle points to shift on the recorded interference patterns. The analysis by the processor unit 70 can then analyze deformations caused by the manipulation and thereby identify in particular surface defects of the workpiece 78.

For the IR thermography, the workpiece 78 is irradiated by a heat source 79, for example an infrared lamp, and an infrared radiation distribution at the surface is recorded by way of an infrared camera 710. The image of the infrared camera 710 is likewise evaluated by the processor unit 70 in the manner described, i.e. by means of comparison with simulations. Defects near the surface can be detected rapidly by means of infrared thermography. As indicated by arrows 711, pores, cracks, shrink holes, delaminations and the like result in an inhomogeneous heat flow within the workpiece 78. This leads to changes in the emission of infrared radiation, as indicated by arrows 712. A defect is visible here only in a certain time window during manufacturing. At a specific time tmax, a maximum thermal contrast dTmax=T2−T1 emerges, wherein T2, T1 are temperatures. The time window is determined by the cooling time for the surface element observed: The introduced heat that led to an increased temperature of the surface element flows away as a result of the thermal conductivity of the rest of the workpiece, of the powder bed, of the protective gas thereabove, and as a result of thermal radiation. The thermal emission arising in this way is a material specific characteristic variable.

These temperature differences, i.e. the thermal emission, are detected by the infrared camera 710 and evaluated. A corresponding material specific emission parameter (this can vary greatly between pores, inclusions, metal oxides, etc.) is then subtracted from the detected thermal emission. The type and position of the defect can be ascertained from this difference.

By way of example, a laser, a light emitting diode arrangement, a flash light or an infrared emitter can serve as the excitation source 79. In some example embodiments, the excitation source 79 operates in a pulsed manner (in pulsed thermography), i.e. the heat is impressed into the surface in an impulsive manner and the infrared image of the surface is measured synchronously.

By means of infrared thermography, the workpiece 78 can be examined reliably for defects for example down to a depth d, as indicated by an arrow 77. As in other test methods illustrated, the examination can be carried out for or after each layer, for or after a plurality of layers or else partial layers.

Figure 8:
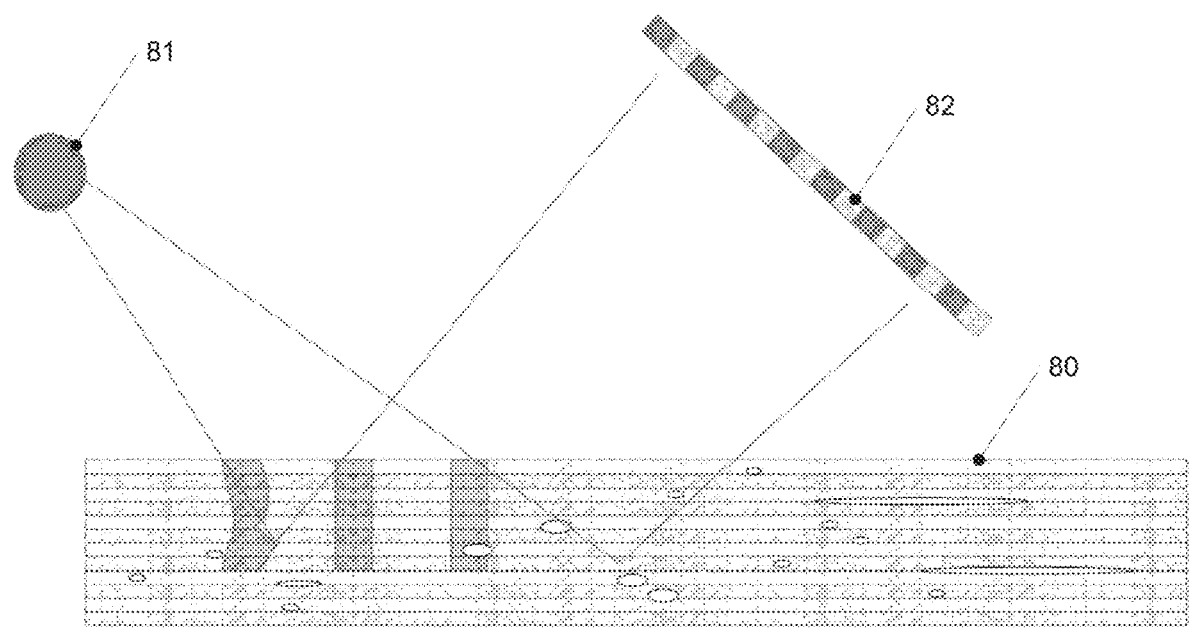
FIG. 8 shows a device for testing a workpiece in accordance with a further embodiment.

A further example of a test method during 3D printing is the use of x-ray radiation. In conventional computed tomography (CRT), the workpiece is completely irradiated and an image is created by shadow casting, called projection, and a three-dimensional model of the examined object is reconstructed from the combination of a plurality of projections by means of mathematical methods such as the radon transform. This method can be used for in situ monitoring during 3D printing for lightweight materials such as plastics. For dense materials such as steel, the penetration capability of the x-ray radiation is generally insufficient. Methods in reflection can be used here, e.g. x-ray scatterometry, an example of which is illustrated in FIG. 8. Components for manufacturing a workpiece 80 (e.g. the laser 24 from FIG. 2 or 5) are not illustrated in FIG. 8; conventional additive manufacturing methods can be used. The workpiece 80 is illuminated with x-ray radiation by an x-ray source 81 and the radiation scattered at the workpiece 80 (e.g. radiation scattered by elastic scattering or Compton scattering) is detected by a planar detector 82. As in the previous example embodiments, the measurement result is additionally simulated, and material defects can be detected on the basis of the simulated and actual measurement results.

One limiting aspect of this measurement technique is the required balancing of parts size and image resolution: large parts require high energy x-ray radiation, which results in an impaired spatial resolution. By contrast, small parts can be imaged with high resolution using low energy x-ray radiation. A high energy here is e.g. x-ray radiation having a photon energy of 100 eV. Low energy is e.g. a photon energy of 10 eV.

For evaluation purposes, the measurement results are analyzed by the methods described, in particular comparison with a simulation and/or by methods of machine learning. As a result, in particular the large volumes of data that arise during this measuring method can be coordinated in order thereby to filter out interference influences partially from the additive manufacturing process. Such an approach of machine learning can be combined with other algorithmic methods that allow a direct reconstruction from the measured data. Such a combination of a plurality of evaluation methods can yield an improved resolution and/or an improved signal to noise ratio.

Moreover, it should be noted that the above described combination of thermography and ESPI can also be used without simulations for the analysis and assessment of additively manufactured workpieces during production, even if the evaluation may be more difficult here. Details concerning such conventional evaluations can be gathered from the references explained above.

The test methods illustrated serve merely for illustration and should not be interpreted as restrictive. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. A method for additive manufacturing, the method comprising:
   obtaining manufacturing data for a workpiece, wherein the manufacturing data defines a plurality of layers of the workpiece;
   simulating additive manufacturing of the workpiece using the manufacturing data, thereby creating a simulated workpiece having a plurality of simulated layers;
   simulating measurement of the plurality of simulated layers in order to determine simulated test results for the workpiece;
   physically producing a set of layers of the plurality of layers using an additive manufacturing process according to the manufacturing data;
   measuring the produced set of layers in order to obtain measured test results for the workpiece;
   evaluating the measured test results using the simulated test results to determine whether manufacturing is acceptable;
   in response to the evaluating indicating acceptable manufacturing, repeating the physically producing, the measuring, and the evaluating for further sets of layers of the plurality of layers; and
   in response to the evaluating indicating unacceptable manufacturing, performing a remedial measure.

2. The method of claim 1, wherein the evaluating comprises supplying the measured test results and the simulated test results to a trained machine learning model.

3. The method of claim 1, wherein the evaluating comprises comparing the simulated test results with the measured test results.

4. The method of claim 1, wherein the remedial measure comprises changing process parameters for physically producing subsequent sets of layers.

5. The method of claim 1, wherein the remedial measure comprises rejecting the workpiece.

6. The method of claim 1, wherein the set of layers comprises at least one of a single layer, a plurality of layers, and a partial layer.

7. The method of claim 1, wherein the evaluating comprises using a predefined correlation of differences between the measured test results and the simulated test results with component properties.

8. The method of claim 1, wherein the measuring comprises carrying out a laser ultrasound process on the produced set of layers.

9. The method of claim 8, wherein:
   the physically producing is performed in a powder bed comprising a powder material,
   the laser ultrasound process uses a laser beam having a pulse frequency of less than $f_{max} = v_M/(d_M + s_M)$,
   $v_M$ is a speed of sound in the powder material,
   $d_M$ is a mean particle diameter of the powder material, and
   $s_M$ is a standard deviation of a size distribution of particles of the powder material.

10. The method of claim 1, wherein the measuring comprises carrying out electronic laser speckle interferometry.

11. The method of claim 1, wherein the measuring comprises carrying out infrared thermography.

12. The method of claim 1, wherein the measuring comprises carrying out an x-ray examination.

13. A device for additive manufacturing, the device comprising:
- a simulation device configured to:
  - simulate additive manufacturing of a workpiece and
  - simulate test results during manufacturing in order to determine simulated test results for the workpiece;
- a manufacturing device configured to perform additive manufacturing of the workpiece layer by layer; and
- a test device configured to test the workpiece during the additive manufacturing in order to obtain measured test results,
- wherein the test device is configured to test the workpiece during manufacturing in order to determine measured test results and
- wherein the simulation device is configured to
  - evaluate the measured test results using the simulated test results and
  - perform a remedial measure in response to the evaluation indicating unacceptable manufacturing of the workpiece.

14. The device of claim 13, wherein the test device comprises at least one of a laser ultrasound test device, an electronic laser speckle interferometry test device, an infrared thermography test device, and an x-ray test device.

* * * * *